INVENTORS
FREDERICK T. FORMAN
EDWARD P. NAWRACAJ
BY Bair, Freeman & Molinare Attys.

July 11, 1967 E. P. NAWRACAJ ETAL 3,331,031

PULSED PENTODE HARTLEY OSCILLATOR WITH INDEPENDENTLY ADJUSTABLE RISE AND FALL TIMES

Filed Feb. 1, 1966 2 Sheets-Sheet 2

INVENTORS
FREDERICK T. FORMAN
EDWARD P. NAWRACAJ

BY Bair, Freeman & Molinare Attys.

United States Patent Office 3,331,031

Patented July 11, 1967

3,331,031

PULSED PENTODE HARTLEY OSCILLATOR WITH INDEPENDENTLY ADJUSTABLE RISE AND FALL TIMES

Edward P. Nawracaj and Frederick T. Forman, Chicago, Ill., assignors to Belltone Electronics Corporation Filed Feb. 1, 1966, Ser. No. 524,325
4 Claims. (Cl. 331—47)

Figure 1:
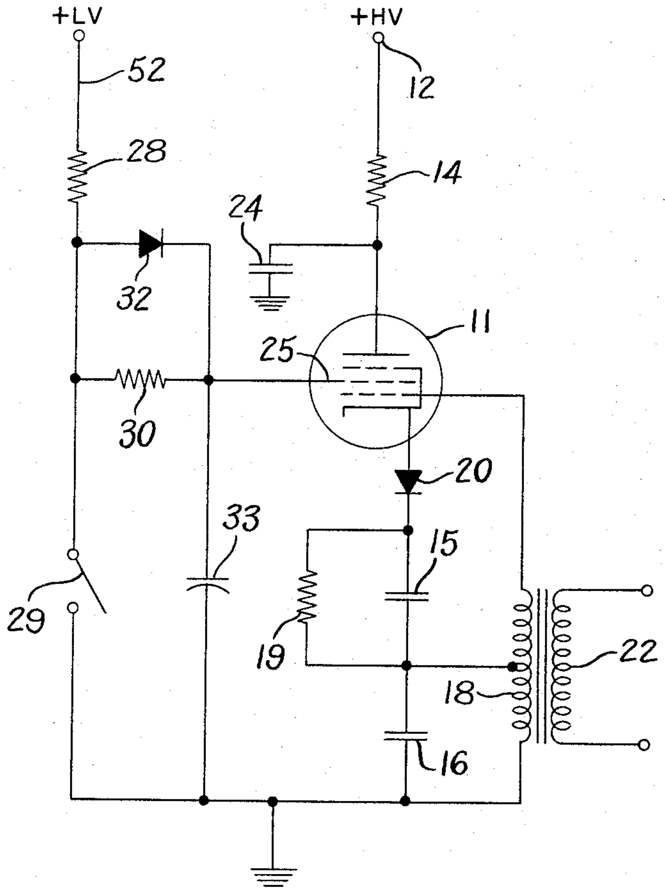

This invention relates to electrical waveform generators and more particularly, although in its broader aspects not exclusively, to controlled oscillators of the type employed in audiometers.

In order to accurately test hearing capability, clinical audiometers must generate pulsed or interrupted audio waveforms having accurately determined rise and fall times. Because of its stability, adaptability and ease of calibration, the Hartley-type pentode oscillator may be used to advantage as the primary tone source in an audiometer. The magnitude of the output signal from such an oscillator may be efficiently controlled by varying the applied screen-grid voltage. Conventional low-level screen-grid pulsing techniques are unsatisfactory in an audiometer, however, because of the standard requirements placed upon the rise and fall times of the output waveform. The oscillator fails to respond equally fast on both rise and decay when pulsed with a screen-grid waveform having equivalent rise and fall times.

It is accordingly an object of the present invention to generate pulsed oscillations having accurately pre-set rise and fall times.

It is the further object of the invention to provide a pulsed tone generator wherein the rise and fall times of the output signal may be adjusted independently.

It is a still further object of the present invention to modulate the output of an audiometer oscillator under manual or automatic control.

In a principal aspect the present invention takes the form of a control circuit for modulating the output from a source of electrical oscillations. The source itself includes a control input and is characterized in that the magnitude of the electrical waveform generated by the source is directly related to the instantaneous magnitude of the direct current signal applied to the control input. The control circuit includes a source of a substantially constant direct current voltage and the series combination of a first resistance and a switch is connected between the terminals of this voltage source. The series combination of a second resistance and a timing capacitor is connected in parallel with the switch. Circuit means are employed for connecting the control input of the waveform source to the junction of the second resistance and the timing capacitor, such that the magnitude of the oscillations produced by the waveform source is related to the magnitude of voltage across the timing capacitor. In accordance with a feature of the invention a diode is connected in parallel with the second resistance and poled such that, when the switch is open, the timing capacitor is charged through the series combination of the first resistor and the diode and, when the switch is closed, the capacitor is discharged through the second resistor. The values of the first and second resistors may accordingly be varried to independently adjust the rise and fall times of the pulsed oscillations.

Figure 2:
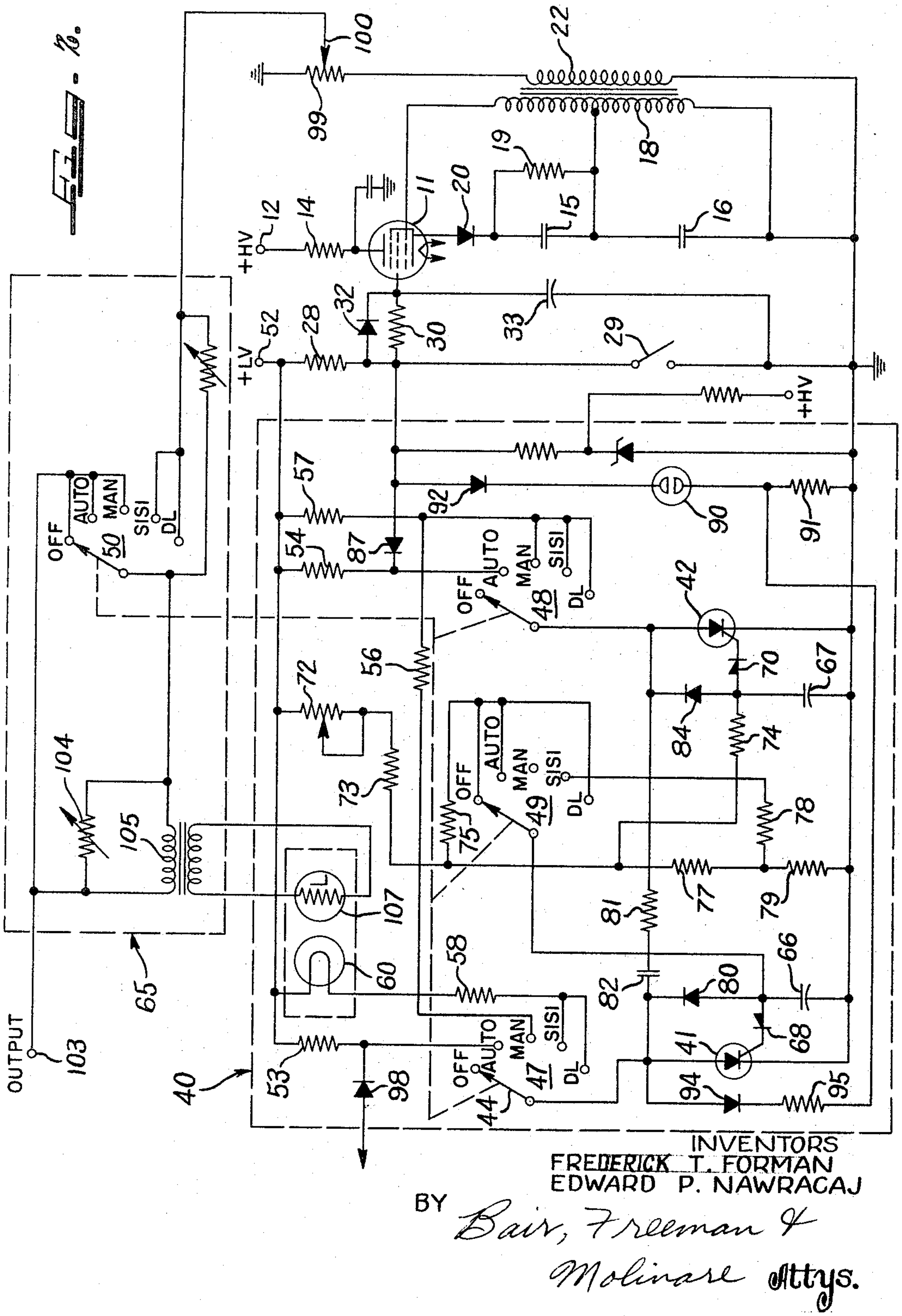

These and other objects, features and advantages of the invention may be more clearly understood through a consideration of the following detailed description of two embodiments of the invention. In the course of this description, reference will frequently be made to the attached drawings in which:

FIG. 1 shows a simplified illustration of a pulsed oscillator embodying principles of the invention; and FIG. 2 is a more detailed illustration of a pulsed oscillator which embodies the principles of the invention and which may be used to instrument a clinical audiometer.

As shown in FIGURE 1 of the drawings, a pentode 11 is used in an oscillator of the Hartley configuration. A positive, high-voltage input terminal 12 is connected to the plate of pentode 11 by means of a resistor 14. The cathode of pentode 11 is connected to ground by the series combination of capacitors 15 and 16 and diode 20. The diode 20 is poled such that cathode current is allowed to flow through the diode 20, resistance 19, and the lower portion of the winding 18 to ground. The control grid of the pentode 11 is connected to ground by the center-tapped winding 18. An output winding 22 is coupled by mutual inductance to the winding 18. A by-pass capacitor 24 is connected between the high-voltage terminal 12 and ground.

With an appropriate fixed potential applied to the screen-grid 25 of the pentode 11, the Hartley oscillator circuit shown in FIGURE 1 delivers oscillations to the output winding 22. The frequency of these oscillations is determined by capacitor 16 and the inductance of winding 18. Increasing the positive potential on screen-grid 25 increases the level of the output signal. The oscillator does not, however, respond as fast to an instantaneous increase in screen-grid potential as it does to an instantaneous decrease. Accordingly, in order to generate oscillations having accurately pre-determined rise and fall times, the control applied to screen grid 25 must be accurately shaped.

In order to generate oscillations having precisely predetermined rise and fall times, the present invention contemplates the use of a novel control circuit in combination with the oscillator. This control circuit as embodied in the circuit shown in FIGURE 1 includes the series combination of a resistor 28 and a switch 29 connected in series between the low voltage terminal 52 and ground. The second resistor 30 is connected between the junction of resistor 28 and the screen-grid 25. A diode 32 is connected in parallel with resistor 30 and a capacitor 33 is connected between the screen-grid 25 and ground.

In operation, with the switch 29 open, the capacitor 33 is charged by a current flowing from the low-voltage terminal 52, through the resistance 28 and the then forward-biased diode 32. When switch 29 is closed, the diode 32 becomes back-biased and the capacitor 33 discharges through the resistance 30 and the switch 29. It should be noted that the charging time-constant is determined by the value of resistor 28 while the discharge time-constant is determined by the value of resistor 30. These two resistance values may be independently varied to adjust both the rise and fall times of the output oscillations within the limits of the oscillator.

After switch 29 has been closed for a substantial length of time and capacitor 33 has consequently become substantially discharged, the screen-grid 25 is essentially zero-biased. The diode 20 is added to the oscillator circuit to eliminate small amounts of plate current that can still flow, even though the screen-grid 25 is at ground potential. This is accomplished by utilizing the small current characteristics of the diode which presents a significant impedance for very low transconductive currents.

The present invention may be readily adapted for automatic pulsing, a feature particularly useful in clinical audiometers. The more detailed embodiment of the invention shown in FIGURE 2 of the drawings includes a pulsed oscillator and control circuit essentially identical to those shown in FIGURE 1 and like reference numerals have been employed to designate like components in both FIGURES 1 and 2. In addition, FIGURE 2 shows the provision of an automatic pulsing circuit 40 which is employed to automatically open and close an electronic switch which is effectively in parallel with the switch 29.

The automatic pulsing circuit 40 includes a pair of controlled rectifiers 41 and 42, the cathodes of which are connected to ground and the anodes of which are connected respectively to movable contacts 44 and 45 of switches 47 and 48 respectively. The switches 47 and 28 are ganged together and with switches 49 and 50. Each of these switches may be set in a selected one of five positions which are respectively designated "OFF," "AUTO," "MAN," "SISI," and "DL." With the switches in the "OFF" position, the anodes of controlled rectifiers 41 and 42 are connected to the otherwise unconnected "OFF" terminal of switches 47 and 48 respectively. With the switches in the "AUTO" position, the anodes of controlled rectifiers 41 and 42 are connected to a low voltage terminal 52 by means of resistors 53 and 54 respectively. The "MAN" terminal of switch 47 is connected by means of a resistor 56 to the "MAN," "DL," and the "SISI" terminals of switch 48, each of which are in turn connected to the low voltage terminal 52 by means of a resistor 57. The "DL" and the "SISI" terminals of switch 47 are connected by means of the series combination of a resistor 58 and the filament of a lamp 60 to the low voltage terminal 52.

As will be more clearly understood after a consideration of the description to follow, the operation of the pulsing circuit 40 is controlled by the five-position switches 47, 48, 49 and 50. In the "OFF" position, the anodes of the controlled rectifiers 41 and 42 are disconnected from the low voltage supply and the pulsing circuit 40 is inoperative. In the "AUTO" (automatic) position, the pulsing circuit 40 operates to repetitiously open and close a circuit in parallel with switch 29 to automatically pulse the oscillator. In the "MAN" (manual) position, the oscillator may be pulsed by manually opening and closing the switch 29. In both the "DL" (difference limen) and the "SISI" (short increment sensitivity index) position, the oscillator remains in an on condition and the pulsing circuit 40 controls a variable attenuating circuit 65 as will be described below.

The controlled rectifiers 41 and 42 are turned on and off in phase opposition under the control of voltages which appear across capacitors 66 and 67 respectively. The capacitor 66 is connected in series with a Shockley diode 68 between the gate electrode of controlled rectifier 41 and ground. In a similar manner, capacitor 67 is connected in series with a Shockley diode 70 between the gate electrode of controlled rectifier 42 and ground. Charging current for the capacitor 67 flows from the positive low voltage terminal 52 through a potentiometer 72, resistors 73 and 74, and the capacitor 67 to ground. With the switches set in either the "OFF," "AUTO," or "DL" positions, charging current for the capacitor 66 flows from the low voltage terminal 52, through potentiometer 72 and resistor 73, through a resistor 75 and the switch 49, to the junction of Shockley diode 68 and capacitor 66. With the switches in the "SISI" position, charging current for the capacitor 66 flows from low voltage terminal 52, through potentiometer 72, resistor 73, resistor 77, resistor 78, the switch 49, and the capacitor 66 to ground. A resistor 79 connects the junction of resistors 77 and 78 to ground. It may thus be seen that the charging time constant for the capacitor 66 is different with the switches in the "SISI" position than when in the "OFF," "AUTO," and "DL" positions. With the switch in the "MAN" position, the junction of capacitor 66 and diode 68 is left unconnected to prevent controlled rectifier 41 from being gated on.

In order to more clearly understand the operation of pulsing circuit 30, consider that the controlled rectifier 41 has been on for some time. The capacitor 66 will then have discharged through a path which includes the conducting controlled rectifier 41 and a diode 80 which is connected between the capacitor 66 and the anode of controlled rectifier 41. The anode of controlled rectifier 41 being effectively at ground potential at this time, and the switches being in the "AUTO" position, a current will flow from the low voltage terminal 52, through the resistor 54 and the switch 48, and through the series combination of a resistor 81 and a commutating capacitor 82, through the conductive controlled rectifier 41 to ground, charging the commutating capacitor 82 to a substantial voltage. The potential at the right hand side of capacitor 82 in this condition will be more positive than the potential at its left hand side. While commutating capacitor 82 is being charged in the fashion described, a charging current also flows through potentiometer 72, resistor 73, resistor 74, and through the capacitor 67, charging capacitor 67 to a continually increasing potential. When the potential across capacitor 67 reaches a pre-determined threshold value sufficient to cause conduction through the Shockley diode 70 and the gate-cathode junction of the controlled rectifier 42, controlled rectifier 42 will be "fired." With conduction through controlled rectifier 42 initiated in this fashion, the capacitor 67 will discharge through the conductive controlled rectifier 42 and a forward biased diode 84, which is connected between the capacitor 67 and the anode of the controlled rectifier 42. While controlled rectifier 42 is conducting, its anode is effectively at ground potential and the pre-existing voltage across commutating capacitor 82 is applied to the anode of controlled rectifier 41. Commutating capacitor 82 thus supplies a negative "turn-off" voltage to the anode of controlled rectifier 41 to terminate conduction therethrough. With the switches set in the "AUTO" position, this cycle of events is repeated to cause the controlled rectifier 42 to be repetitiously placed in a state of conduction and non-conduction.

The controlled rectifier 42, when the switches are in the "AUTO" position, is effectively placed in parallel with the switch 29 by means of a diode 87 which is connected between the "AUTO" terminal of switch 48 and the junction of resistor 28 and switch 29. Diode 87 is poled in a direction to prevent the flow of current through resistance 54, diode 87, resistance 30, and capacitor 33 when the controlled rectifier 42 is non-conducting.

A tone-indicating neon lamp 90 is employed to indicate those time intervals during which tone is presented at the output winding 22 either by manual or by automatic pulsing. One terminal of the lamp 90 is connected to ground through a resistance 91 while its other terminal is connected to the junction of diode 87 and resistor 30 by means of a diode 92. With both switch 29 and controlled rectifier 42 open, a high positive voltage appears at the anode of diode 92 causing current flow through the diode 92, the lamp 90 and resistance 91 thereby producing a visible signal from the lamp 90. When either controlled rectifier 42 or switch 29 are conducting, the potential existing at the anode of diode 92 is quite low. Nonetheless, in order to insure that the lamp 90 is extinguished, a diode 94 and a resistance 95 are serially connected from the anode of controlled rectifier 41 to the junction of 90 and resistor 91. Thus, when controlled rectifier 41 is non-conductive, positive current flow takes place from the anode of controlled rectifier 41 through the forward biased diode 94, resistor 95 and the resistor 91. Thus a voltage drop is produced across resistor 91 which insures that diode 92 will be back-biased and the lamp 90 turned off.

Because of the bilateral character of the pulsing circuit 40, the embodiment of the invention shown in FIGURE 2 of the drawings may be readily adapted to pulse an additional oscillator as well. Such an oscillator may well take the same form as the oscillator shown in FIGURE 1 of the drawings and include a rise and fall time control circuit of the type shown in FIGURE 1. The manner of connecting and pulsing such an additional oscillator is illustrated in FIGURE 2 of the drawings by the connection of a diode 98 to the "AUTO" terminal of switch 47. Diode 93 corresponds to the diode 87 which is connected to the right hand side of the pulsing circuit 40.

In making clinical tests of hearing, it is often helpful to determine the patient's awareness to very small changes in the magnitude of the supplied tone. This function is provided readily in the circuit shown in FIGURE 2 of the drawings by means of the controlled attenuator circuit 65. The output from the oscillator winding 22 is first supplied across a potentiometer 99. The variable tap 100 on potentiometer 99 thus provides the input signal to the controlled attenuator circuit 65. With the switches 47 through 50 in the "OFF," "AUTO," or the "MAN" positions, the movable tap 100 is directly connected through a calibration potentiometer 102 and the switch 50 to an output terminal 103. With the switch 50 in the "DL" or the "SISI" positions, the output tap 100 is connected through the switch 50 and the parallel combination of a potentiometer 104 and a winding 105 to the output terminal 103. Winding 105 is coupled by mutual inductance to a winding 106 which is in turn connected to a light dependant resistance 107. Thus, the impedance presented by the winding 105 is the reflected impedance of the light dependant resistance 107. Therefore, when the lamp 60 is lit, the resistance of light dependant resistor 107 changes to alter the tone level presented to the output 103.

The lamp 60 is connected in series with the controlled rectifier 41 whenever the switches 47 through 50 are in either the "DL" or the "SISI" positions. The "DL" (difference limen) and the "SISI" (short increment sensitivity index) tests are essentially identical except that the on-off timing is altered. As an example, in the "DL" position, the lamp 60 may be lit for 300 ms. and extinguished for 300 ms. while in the "SISI" position the lamp may be lit for 300 ms. and extinguished for 5 seconds. This difference in timing is accomplished by the switch 49 which connects different resistances in the charging path for the capacitor 66 as hereinbefore described. The potentiometer 72 may be adjusted to control the overall recycling time.

It is to be understood that the embodiments of the invention which have been described are merely illustrative of applications of the principles of the invention. Numerous modifications may be made by those skilled in the art without departing from the true scope and spirit of the invention.

What is claimed is:

1. In combination, a controllable source of electrical oscillations having an output and a control input, the magnitude of said electrical oscillations being related to the magnitude of a direct current signal applied to said control input, a source of a substantially constant direct voltage having first and second terminals, the series combination of a first resistance and a switch connected between said terminals, the series combination of a second resistance and a timing capacitor connected in parallel with said switch, means for connecting said control terminal to the junction of said second resistance and said capacitor such that the magnitude of said oscillations is related to the magnitude of voltage across said capacitor, and a diode connected in parallel with said second resistance and poled such that when said switch is open said capacitor is charged through said resistance and said diode and when said switch is closed said capacitor is discharged through said second resistance.

2. The combination set forth in claim 1 wherein said source of electrical oscillations comprises a pentode oscillator and wherein the screen grid of said pentode constitutes said control input.

3. The combination set forth in claim 1 including means for automatically opening and closing said switch.

4. The combination set forth in claim 3 wherein said switch is a controlled rectifier having a transconductive path and a gating electrode and wherein said means for automatically opening and closing said switch comprises a source of periodic turn-on pulses connected to said gating electrode and a source of periodic turn off signals connected across said transconductive path.

No reference cited.

ROY LAKE, *Primary Examiner.*

S. H. GRIMM, *Assistant Examiner.*